United States Patent [19]

Choi

[11] Patent Number: 5,202,853
[45] Date of Patent: Apr. 13, 1993

[54] CIRCUIT FOR PERFORMING A PARALLEL WRITE TEST OF A WIDE MULTIPLE BYTE FOR USE IN A SEMICONDUCTOR MEMORY DEVICE

[75] Inventor: Yoon-Ho Choi, Inchun, Rep. of Korea

[73] Assignee: Samsung Electronics Co., Ltd., Suwon, Rep. of Korea

[21] Appl. No.: 488,739

[22] Filed: Feb. 28, 1990

[30] Foreign Application Priority Data

Jun. 13, 1989 [KR] Rep. of Korea ............ 1989-8098

[51] Int. Cl.⁵ .................................. G11C 29/00
[52] U.S. Cl. .......................... 365/201; 365/189.04
[58] Field of Search ............ 365/189.04, 230.03, 365/230.06, 189.08, 201, 218, 238.5; 371/21.1, 21.2, 21.3, 27

[56] References Cited

U.S. PATENT DOCUMENTS

| | | | |
|---|---|---|---|
| 4,692,901 | 9/1987 | Kumanoya et al. | 365/189.04 |
| 4,744,061 | 5/1988 | Takemae et al. | 365/230.03 |
| 4,873,669 | 10/1989 | Furutani et al. | 365/230.03 |
| 4,881,200 | 11/1989 | Urai | 365/230.03 |
| 4,899,313 | 2/1990 | Kumanoya et al. | 365/230.03 |
| 4,907,203 | 3/1990 | Wada et al. | 365/230.03 |
| 4,965,769 | 10/1990 | Etoh et al. | 365/218 |

Primary Examiner—Joseph L. Dixon
Assistant Examiner—Jack A. Lane
Attorney, Agent, or Firm—Robert E. Bushnell

[57] ABSTRACT

A multiple byte wide parallel write circuit having a number of cell array blocks for storing data, and a plurality of data input buffers includes a plurality of data bus selectors for selecting data buses, a plurality of clock pulse generators for generating clock signals for an individual data input driver on the basis of a test mode enable signal and a column/row address signal, and a plurality of individual data input drivers for driving respective outputs of the data bus selectors and for applying the output driven to the entire input/output (I/O) lines at the same time. Thereby, the improvement may write into the memory cell arrays the data having a greater number of bit lines than that of the data buses, without increasing the layout area nor increasing the load on the bus lines.

17 Claims, 3 Drawing Sheets

CIRCUIT FOR PERFORMING A PARALLEL WRITE TEST OF A WIDE MULTIPLE BYTE FOR USE IN A SEMICONDUCTOR MEMORY DEVICE

BACKGROUND OF THE INVENTION

The present invention generally relates to a write chain circuit for a parallel test in a high density semiconductor memory device and, more particularly, to multiple byte wide parallel write circuits in which the number of data bits, written during one cycle, is not limited to the number of data buses, and which is capable of simultaneously writing a number of data bits equal to the number of data input/output (I/O) lines.

In general, a semiconductor memory device such as, in particular, a dynamic random access memory (DRAM), reads/writes in parallel a number of data bits equal to the number of data buses. Accordingly, the data having a number of bits equal to the number of data buses are written in parallel during one cycle when the parallel write test is made in the semiconductor memory device. However, when there is a need to expand the semiconductor memory device capacity, the number of data bits must be increased accordingly so as to perform the above parallel write test properly, in the same manner as presented above. Therefore, when its capacity is expanded, the semiconductor memory device widens its dimension (chip area) greatly because of a necessity for increasing the number of data buses. In addition, as the number of the data bits increases, the load of the semiconductor memory device increases correspondingly. In conclusion, it is a drawback of the prior art device that the data processing speed is lowered when performing the write test, especially in a expanded semiconductor memory device.

SUMMARY OF THE INVENTION

An object of the present invention is therefore to provide a multiple byte wide parallel write circuit capable of writing, at a same time, data having the same number of bits as the number of input/output (I/O) lines, without limiting the number of the data bits, which are written during one write cycle, to the number of data buses.

Another object of the present invention is to provide a multiple byte wide parallel write circuit for decreasing the overall write testing time by greatly increasing the number of parallel write bits, without increasing the dimension for layout thereof and the load carried thereon.

According to one aspect of the present invention to achieve the object and features of the invention, a multiple byte wide parallel write circuit for use in a semiconductor memory device, the write circuit has a number of cell array blocks comprised of a plurality of I/O lines, each I/O line being comprised in pairs, and a plurality of data input buffers for buffering to respective data bus lines the input data received from data input pads or the input data received from data input/output multiplexed pads, in response to a clock pulse applied from a buffer input control clock generator, includes a plurality of data bus selectors for selecting the data buses which are output lines of the data input buffers on the basis of a respective data bus selector control signal, a plurality of clock pulse generators for generating a control clock for an individual data input driver on the basis of a test mode enable signal and a column/row address signal, and a plurality of individual data input drivers for driving respective output of the data bus selectors and for applying the output driven to the entire input/output (I/O) lines at a same time, the I/O lines being connected to the respective individual data input driver one to one, on the basis of the clock pulses generated from the clock pulse generators.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENTS

An embodiment of the multiple byte wide parallel write circuit for high speed memory test will now be described with reference to the accompanying drawings, by way of an example. Throughout the drawings, like reference symbols are used to designate like or equivalent parts or portions, for simplicity of illustration and explanation.

Figure 1:
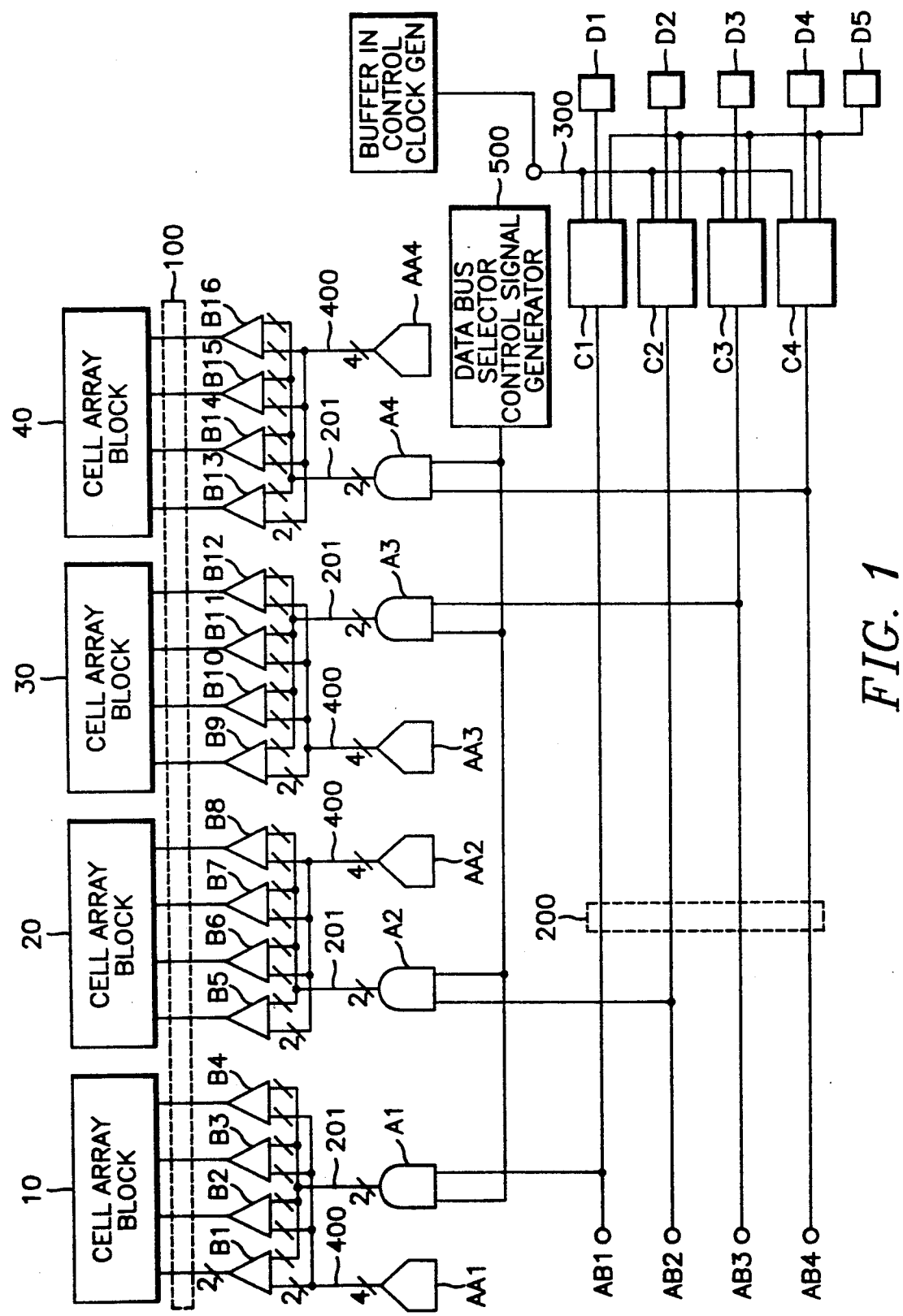
FIG. 1 is schematic diagram of a multiple byte wide parallel write circuit according to the present invention.

With particular reference to FIG. 1, cell array blocks 10-40 have a plurality of I/O lines 100 made in pairs respectively. Data input buffers $C_1$-$C_4$ buff the input data received from a data input pad $D_5$ or the input data received from data input/output multiplexed pads $D_1$-$D_4$ and provide the buffered data to data bus lines 200 made in pairs respectively, on the basis of a buffer input clock signal 300. Data bus selectors $A_1$-$A_4$ select the data $Ab_i(AB_1$-$AB_4)$ on the output lines of the data input buffers $C_1$-$C_4$, in response to the clock signal received from the data bus selector control signal generator 500. Clock pulse generators $AA_1$-$AA_4$ generate control clock pulses for controlling a number of individual data input drivers $B_1$-$B_{16}$ which drive the respective data passed through the data bus selectors $A_1$-$A_4$ to be suited for input of the cell array blocks 10-40, on the basis of a test mode enable clock signal and column/row address signal. According to the control clock pulses generated from the clock pulse generators $AA_1$-$AA_4$, the individual data input drivers $B_1$-$B_{16}$ drive the data selected by the data bus selectors $A_1$-$A_4$ and then provide the driven data to the entire I/O lines 100 at a same time, the I/O lines being connected to the I/O lines of the cell array blocks 10-40 one to one.

Figure 2:
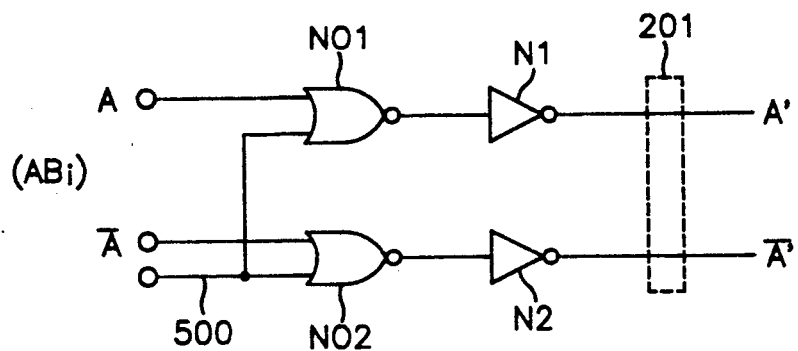
FIG. 2 is a detailed circuit illustrating one of the data bus selectors ($A_1$-$A_4$) of FIG. 1 in detail according to the present invention.

Referring now to FIG. 2, one of the data bus selectors $A_1$-$A_4$ of FIG. 1 is illustrated in detail in accordance with the present invention. In the drawing, the data buses $AB_i$ ($AB_1$-$AB_4$) made in pairs of data lines A, $\overline{A}$ are connected to any one of either input of NOR gates $NO_1$, $NO_2$, respectively. The other input terminals of the NOR gates $NO_1$, $NO_2$ are commonly connected to the clock signal generated from the data bus selector control clock pulse generator 500. In addition, the respective output of the NOR gates $NO_1$, $NO_2$ are connected to inverters $N_1$, $N_2$ so that the respective output of the inverters $N_1$, $N_2$ is coupled to the individual data input drivers $B_1-B_{16}$.

Figure 3:
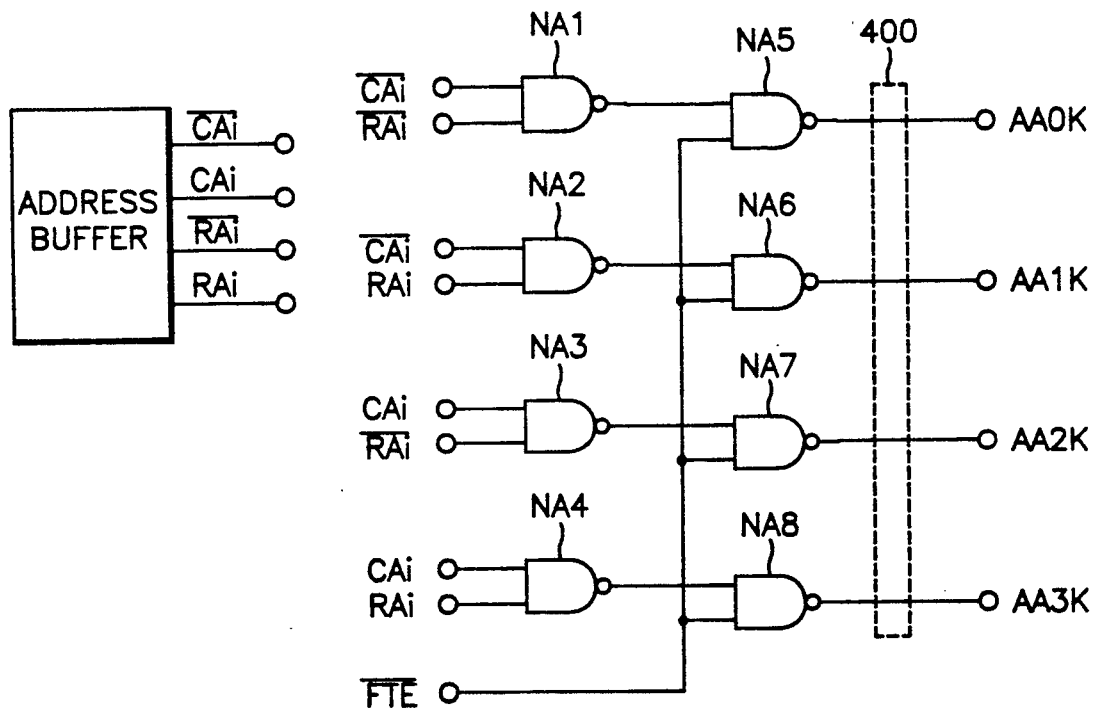
FIG. 3 is a detailed circuit illustrating one of the clock pulse generators ($AA_1$-$AA_4$) of FIG. 1.

Referring to FIG. 3, one of the clock pulse generators $AA_1-AA_4$ of FIG. 1 is illustrated according to the present invention, wherein the column/row address terminals CAi, $\overline{CAi}$, RAi, $\overline{RAi}$ are coupled to NAND gates $NA_1-NA_4$ as illustrated, and a test mode enable terminal $\overline{FTE}$ is coupled to any one of the input terminals of each of the NAND gates $NA_5-NA_8$ of which the other input terminals are coupled to respective output terminals of the NAND gates $NA_1-NA_4$. Then, the respective output terminals of the NAND gates $NA_5-NA_8$ are coupled to the control clock lines 400 ($AA_{0k}-AA_{3k}$) which are the input of the individual data input drivers $B_1-B_{16}$.

Figure 4:
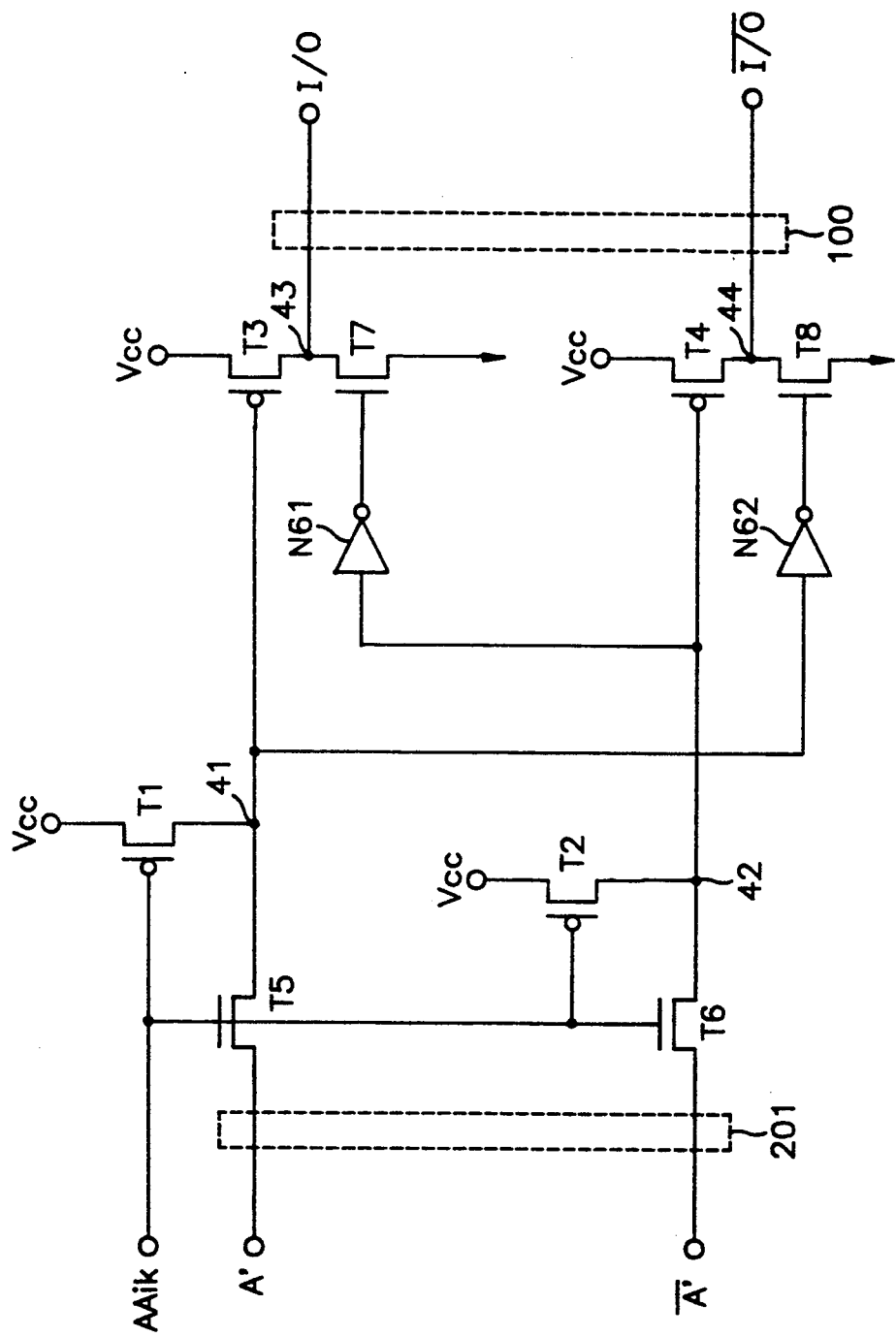
FIG. 4 is a detailed circuit of an individual one of the data input drivers ($B_1$-$B_{16}$) of FIG. 1.

Referring further to FIG. 4, the individual data input drivers $B_1-B_{16}$ are illustrated according to the present invention, in which a line $AA_{ik}$ of the control clock pulse lines 400 is connected to the gates of the P-channel MOS (PMOS) transistors $T_1$, $T_2$ and, at the same time, connected to the gates of the N-channel MOS (NMOS) transistors $T_5$, $T_6$. Then, a pair of data lines $A'$, $\overline{A'}$ are the output of the data bus selectors $A_1-A_4$ are connected to the respective source of the NMOS transistors $T_5$, $T_6$. The gate of a PMOS transistor $T_3$ and the input of an inverter $N_{62}$ are commonly connected to a first node 41 to which the respective drains of the PMOS transistor $T_1$ and the NMOS transistor $T_5$ are also connected. In the same manner, the gate of a PMOS transistor $T_4$ and the input of an inverter $N_{61}$ are commonly connected to a second node 42 to which the respective drains of the PMOS transistor $T_2$ and the NMOS transistor $T_6$ are also connected. Thereafter, the output signals of the inverters $N_{61}$, $N_{62}$ are respectively coupled to the gates of NMOS transistors $T_7$, $T_8$. Thus, a third node 43 formed between the respective drains of the PMOS transistor $T_3$ and the NMOS transistor $T_7$, and a fourth node 44 formed between the respective drains of the PMOS transistor $T_4$ and NMOS transistor $T_8$ are respectively connected one of the I/O lines 100 which are, at the same time, connected to the cell array 10-40 by way of the respective bit lines thereof so as to access the memory cells.

The embodiment of the invention will be described more specifically hereinbelow with reference to FIG. 1 through FIG. 4. For the convenience of explaining the illustrated embodiment, only two groups of cell array blocks 10-40 are described out of a plurality of the cell array blocks as illustrated in FIG. 1. The plurality of data I/O lines 100 of the cell array blocks 10-40 are coupled to the bit lines of the cell array blocks 10-40, thereby to access the memory cells. The respective data I/O lines 100 are driven by the output of the individual data input drivers $B_1-B_{16}$ and the respective blocks receive the data selected by the data bus selectors $A_1-A_4$ on the basis of the control clock pulse generated from the control clock pulse generators $AA_1-AA_4$. The data bus selectors $A_1-A_4$ select the data on the data buses $AB_i$ ($AB_1-AB_4$) and provide them to the individual data input drivers $B_1-B_{16}$, on the basis of the clock pulse applied from the data bus selector control signal generator 500. Since the data input buffers $C_1-C_4$ are coupled to the respective data bus lines $AB_1-AB_4$, the data bus lines $AB_1-AB_4$ are driven by the data received from the data input pad $D_5$ and the data I/O multiplexed pads $D_1-D_4$, on the basis of the buffer input clock signal 300. In other words, the buffer input clock signal 300 plays the role of providing to the data input buffers $C_1-C_4$ the data received from the data I/O multiplexed pads $D_1-D_4$ and the data input pad $D_5$. Since the data bus selectors $A_1-A_4$ are connected to the existing data bus lines $AB_1-AB_4$ and the individual data input drivers $B_1-B_{16}$ prepared in this embodiment of the invention are the same in number with the data I/O lines 100, if one or more than one cell array blocks 10-40 is activated, the data may be written in parallel, at a same time, on the cell array blocks 10-40 through the entire data I/O lines 100.

In more detail to the parallel test operation, the data received from the data I/O multiplexed pads $D_1-D_4$ and the data received from the data input pad $D_5$ are buffered in the data input buffers $C_1-C_4$ and then provided to the data bus lines 200, in response to the buffer input clock signal 300. Then, the data on the data bus lines 200 is selected correspondingly by the data bus selectors $A_1-A_4$, in response to the clock pulse of the data bus selector control clock generator 500. That is to say, as best illustrated in FIG. 2, the data on the data lines $A$, $\overline{A}$ of the data buses $AB_i$ ($AB_1-AB_4$) is selected by the NOR gates $NO_1$, $NO_2$ dependently upon the logic state of the data bus selector control clock generator 500. Therefore, it is noted that when the data applied to the two input terminals of the respective NOR gates $NO_1$, $NO_2$ is both at the logic "low" state, the NOR gates $NO_1$, $NO_2$ produce the logic "high" state to the inverters $N_1$, $N_2$ by which the previous logic states are inverted. For example, if the clock signal from the data bus selector control clock generator 500 is logic "low" and the data on the input line $A$ of the NOR gate $NO_1$ is at the logic "high" state, then the NOR gate $NO_1$ generates the logic "low" state to the inverter $N_1$ which inverts the logic states to logic "high" state. In this case, the data on the data lines $A$, $\overline{A}$ is complementary to each other, therefore the output of the circuit is also complementary, i.e., with the same logic condition as given above, the output of the inverter $N_2$ will be at the logic "low" state. Thereafter, the output data is transferred to the individual data input drivers $B_1-B_{16}$.

The clock pulse generators $AA_1-AA_4$, as best illustrated in FIG. 3, generate the clock pulse for controlling the individual data input drivers $B_1-B_{16}$, in response to the signal applied to the test mode enable terminal $\overline{FTE}$. In operation, the signals inputted through the column/row address terminals CAi, $\overline{CAi}$, RAi, $\overline{RAi}$ are first processed logically by the NAND gates $NA_1-NA_4$, and then the output signals are logically processed by the NAND gates $NA_5-NA_8$, in response to the enable clock pulse inputted through the test mode enable terminal $\overline{FTE}$ so as to be transferred to the individual data input driver control clock pulse lines 400 ($AA_{0k}-AA_{3k}$).

The output signals generated from the individual data input control clock pulse lines $AA_{0k}-AA_{3k}$ are transferred to one of the individual data input drivers $B_1-B_{16}$, which are best illustrated in FIG. 4. That is, the output signals $AA_{0k}-AA_{3k}$ of FIG. 3 are applied to the PMOS transistors $T_1$, $T_2$ and NMOS transistor $T_5$, $T_6$ of FIG. 4, as the control clock pulse of the individual data input drivers $B_1-B_{16}$. For example, if an individual data driver control clock pulse $AA_{ik}$ is at the logic "high" state, the NMOS transistors $T_5$, $T_6$ are turned on and a predetermined data of the data lines $A'$, $\overline{A'}$ (for example, the logic "high" on the data line $A'$ and the logic "low" on the data line $\overline{A'}$ are provided) of the data bus selectors $A_1-A_4$ will be respectively passed to the first and second nodes 41, 42 by way of the NMOS transistors $T_5$, $T_6$. Then, the first node 41 becomes the logic "high"

state while the second node 42 becomes the logic "low" state, and the PMOS transistor $T_3$ and the NMOS transistor $T_8$ are turned off because of the logic "high" state of the first node 41. On the other hand, the PMOS transistor $T_4$ and the NMOS transistor $T_7$ are turned on because of the logic "low" state of the second node 42. Thus, the logic states of the data lines A', $\overline{A}'$ are inverted in the individual data input buffers $B_1$-$B_{16}$ and transferred to the cell array blocks 10-40 by way of the data I/O lines 100 (I/O,$\overline{I/O}$) so as to be written into a corresponding memory cell.

On the other hand, if the individual data driver control clock pulse $AA_{ik}$ is at the logic "low" state, the PMOS transistors $T_1$, $T_2$ are turned on while the NMOS transistors $T_5$, $T_6$ are turned off, causing the first node 41 and the second node 42 to be both at the logic "high" state. At this moment, since the NMOS transistors $T_7$, $T_8$ and the PMOS transistors $T_3$, $T_4$ are all turned off, the I/O lines 100 are cut off from the individual data input buffers $B_1$-$B_{16}$.

Therefore, it is understood that since the respective data bus lines $AB_i$ ($AB_1$-$AB_4$) are driven by the data input buffers $C_1$-$C_4$ which can be enabled by the buffer input clock signal 300 during the parallel test mode and the respective data bus selectors $A_1$-$A_4$ are driven according to the control clock inputted from the data bus selector control clock generator 500, the data on the data bus lines $AB_i$ ($AB_1$-$AB_4$) is transferred to the individual data input drivers $B_1$-$B_{16}$ and is written into a memory cell. In addition, the data provided to the individual data input drivers $B_1$-$B_{16}$ is driven in the manner that is described in detail in connection with FIG. 4 and is saved (written) into the cell array blocks 10-40 through the respective data I/O lines 100. In a normal read/write mode, the control clock pulse received through the data bus selector control clock generator 500 enables one of the data bus selectors $A_1$-$A_4$ and the control clock pulse of the individual data input driver control clock generators $AA_1$-$AA_4$ enables again one of the individual data input drivers $B_1$-$B_{16}$, thereby finally the data may be saved (written) into one of the cell array blocks 10-40.

As is described above, the improvement writes into a memory cell the data having a greater number of bit lines than that of the data buses, without increasing the layout area nor increasing the load on the bus lines. Therefore, the invention has an advantage of decreasing the time-loss during the write test in a semiconductor memory device and of elevating the processing speed of the write test without increasing the layout area and the load on the bus lines.

What is claimed is:

1. A circuit for performing a parallel write of a wide multiple byte in a semiconductor memory disk having a plurality of cell array blocks comprised of a plurality of input/output lines, a plurality of data input buffers for buffering, to a plurality of data bus lines, input data from a data input pad and multiple data from a plurality of input/output multiplexed pads on the basis of a buffer input control clock signal, comprising:

a plurality of data bus selectors for selecting the data bus lines, said data bus lines being respectively connected to outputs of the data input buffers, on the basis of a control clock signal received from a data bus selector control clock generator;

a plurality of individual data input drivers for driving the output of respective ones of said data bus selectors and simultaneously providing an output to said input/output lines, each of said input/output liens being coupled to respective data bit lines of said cell array blocks one to one, on a basis of a clock pulse generated from clock pulse generators; wherein each of said data bus selectors comprise:

first gating means for performing a logical operation on data received from a first input of said data bus lines, on a basis of the control clock signal received from said data bus selector control clock generator to provide an output signal;

second gating means for performing a logical operation on data received from a second input of said data bus lines, on the basis of said control clock signal inputted from said data bus selector control clock generator;

first means for inverting the output signal of said first gating means, said inverted output signal being coupled to said individual data input drivers; and second means for inverting the output signal of said second gating means, said inverted output signal being coupled to said individual data input drivers;

said input and output of said first inverting means being complementary to said input and output of said second inverting means.

2. The circuit of claim 1, wherein each of said clock pulse generators comprise:

means for decoding a combination of column/row address signals; and means for selectively providing a clock pulse to one of a plurality of output lines by receiving the output of said decoding means, on a basis of a test mode enable signal.

3. The circuit of claim 2, wherein each of said individual input drivers comprise:

means for passing data received from a respective one of said data bus selectors; on a basis of the output of a respective one of said clock pulse generators; and output means for inverting an output of said passing means and providing inverted data to the input-/output lines.

4. The circuit of claim 3, wherein each of said passing means comprises:

a first transistor and a second transistor whose gates are commonly coupled to a clock signal of the respective clock pulse generator and whose drains are commonly coupled to a power supply; and a third transistor and a fourth transistor whose drains are connected to sources of the first and the second transistors respectively, the sources of said third and said fourth transistors being coupled to respective data from the data bus selectors.

5. The circuit of claim 4, wherein said output means for inverting comprises:

a fifth and a sixth transistor for inverting the data passed through said first passing means, the gate of the fifth transistor being coupled to said drain of the third transistor, the gate of the sixth transistor being coupled to said drain of the fourth transistor by way of an inverter, the sources of the fifth and the sixth transistors being commonly coupled to a first output thereof; and seventh and eighth transistors for inverting the data passed through said second passing means, the gate of the seventh transistor being coupled to drain of the fourth transistor, the gate of the eighth transistor being coupled to the drain of the third transistor by way of an inverter, the sources of the seventh and eighth transistors being commonly coupled to a second output thereof;

whereby data based through the third transistor turns off/on the fifth and the eight transistors and data passed through the fourth transistor turns on/off the sixth and the seventh transistors in response to the control clock signal.

6. The circuit of claim 5, wherein said first, second, fifth and seventh transistors are p-channel metal-oxide-semiconductor transistors.

7. The circuit of claim 6, wherein said third, fourth, sixth and eighth transistors are n-channel metal-oxide-semiconductor transistors.

8. A circuit for performing a parallel writing of a multiple byte into semiconductor memory comprising:

plural input/output multiplexed pads for providing data to a corresponding plurality of data input buffers of said semiconductor memory;

a data input pad for providing data to each of said data input buffers;

plural data bus lines corresponding to said plural data input buffers for providing data to corresponding data bus selectors;

plural clock pulse generators corresponding to said data bus selectors for providing respective control clock pulses to a plurality of data input drivers;

said plurality of data input drivers receiving data from said data bus selectors for providing a plurality of data bits on a corresponding plurality of input/output data lines wherein said plurality of input/output lines is greater in number than said plural data bus lines; and plural memory cell array blocks for storing said plurality of data bits provided by said plurality of data input drivers; and a data bus selector control signal generator for providing a control signal to said data bus selectors; wherein each of said data bus selectors respectively comprise:

a first NOR gate for receiving first data from one of said plural data bus lines at a first input and for receiving said control signal for providing a first output signal;

a second NOR gate for receiving second data from said one of said bus lines complementary to said first data from said one of said data bus lines and for receiving said control signal for providing a second output signal;

a first inverter for inverting said first output signal and for providing a first inverted output signal to respective ones of said plurality of data input drivers; and a second inverter for inverting said second output signal and for providing a second inverted output signal to said respective ones of said plurality of data input drivers.

9. The circuit for performing a parallel writing of a multiple byte into a semiconductor memory as set forth in claim 8, wherein said plural data input buffers are controlled by a buffer input clock signal for buffering data, from said plural input/output multiplexed pads or said data input pad, to said plural data bus lines.

10. The circuit for performing a parallel writing of a multiple byte into a semiconductor memory as set forth in claim 9, wherein said plural clock pulse generators are responsive to a test mode enable signal, column address signals and row address signals for generating said respective control clock pulses.

11. The circuit for performing a parallel writing of a multiple byte into a semiconductor memory as set forth in claim 10, wherein each of said plural clock pulse generators respectively comprise:

a first gate means for receiving a first column address signal, a first row address signal and said test mode enable signal for providing a first control clock pulse;

a second gate means for receiving said first column address signal, a second row address signal complementary to said first row address signal and said test mode enable signal for providing a second control clock pulse;

a third gate means for receiving a second column address signal complementary to said first column address signal, said first row address signal and said test mode enable signal for providing a third control clock pulse; and a fourth gate means for receiving said second column address signal, said second row address signal and said test mode enable signal for providing a fourth control clock pulse;

wherein said first, second, third and fourth control clock pulses are provided to respective ones of said plurality of data input drivers for enabling said respective ones of said plurality of data input drivers to provide data from said data bus selectors to said memory cell array blocks.

12. The circuit for performing a parallel writing of a multiple byte into a semiconductor memory as set forth in claim 11, wherein each of said first, second, third and fourth gate means respectively comprise:

a first NAND gate for receiving said column and row address signals at respective input terminals of said first NAND gate; and a second NAND gate having a first input terminal connected to an output terminal of said first NAND gate, a second input terminal for receiving said test mode enable signal and an output terminal for providing a respective one of said control clock pulses.

13. The circuit for performing a parallel writing of a multiple byte into a semiconductor memory as set forth in claim 12, wherein each of said plurality of data input drivers respectively comprise:

a first transistor connected between a power source and a first node for receiving one of said control clock pulses;

a second transistor connected between said power source and a second node for receiving said one of said control clock pulses;

a third transistor for receiving said one of said control clock pulses and said first inverted output signal and having an output connected to said first node;

a fourth transistor for receiving said one of said control clock pulses and said second inverted output signal and having an output connected to said second node;

a fifth transistor connected between said power source and a third node and having a control input connected to said first node;

a sixth transistor connected between said power source and a fourth node and having a control input connected to said second node;

a seventh transistor connected between said third node and a reference potential and having a control input connected via a third inverter to said second node; and an eighth transistor connected between said fourth node and said reference potential and having a control input connected via a fourth inverter to said first node;

wherein said third and fourth nodes provide output signals complementary to said first and second inverted output signals to a respective one of said plural memory cell array blocks when said one of said control clock pulses is in a first state, and wherein said third and fourth nodes do not provide an output signal if said one of said control clock pulses is in a second state.

14. The circuit for performing a parallel writing of a multiple byte into a semiconductor memory as set forth in claim 13, wherein said first, second, fifth and sixth 15. The circuit for performing a parallel writing of a multiple byte into a semiconductor memory as set forth in claim 14, wherein said third, fourth, seventh and eighth transistors are NMOS transistors.

16. A circuit for performing a parallel writing of a multiple byte into a semiconductor memory comprising:

plural data bus lines for providing data to corresponding data bus selectors;

plural clock pulse generators corresponding to said data bus selectors for providing respective control clock pulses to a plurality of data input drivers;

said plurality of data input drivers receiving data from said data bus selectors for providing a plurality of data bits on a corresponding plurality of input/output data lines wherein said plurality of input/output lines is greater in number than said plural data input drivers; and a data bus selector control signal generator for providing a control signal to said data bus selectors; wherein each of said data bus selectors respectfully comprise:
 a first NOR gate for receiving first data from one of said plural data bus liens at a first input and for receiving said control signal for providing a first output signal;
 a second NOR gate for receiving second data from said one of said bus lines complementary to said first data from said one of said data bus lines and for receiving said control signal for providing a second output signal;
 a first inverter for inverting said first output signal and for providing a first inverted output signal to respective ones of said plurality of data input drivers; and
 a second inverter for inverting said second output signal and for providing a second inverted output signal to said respective ones of said plurality of data input drivers.

17. The circuit for performing a parallel writing of a multiple byte into a semiconductor memory as set forth in claim 16, further comprising:

plural input/output multiplexed pads for providing data to a corresponding plurality of data input buffers of said semiconductor memory; and a data input pad for providing data to each of said data input buffers;

wherein said plural data input buffers are controlled by a buffer input clock signal for buffering data, from said plural input/output multiplexed pads or said data input pad, to said plural data bus lines.

* * * * *

UNITED STATES PATENT AND TRADEMARK OFFICE
CERTIFICATE OF CORRECTION

PATENT NO. : 5,202,853

DATED : 13 April 1993

INVENTOR(S) : Yoon-Ho Choi

Page 1 of 3

It is certified that error appears in the above-identified patent and that said Letters Patent is hereby corrected as shown below:

Column 2,

Line 41,    replace "$Ab_i$" with --$AB_i$--;

Line 67,    replace "output" with --outputs--;

Column 3,

Line 8,    delete "any";

Column 4,

Line 41,    replace "pulse" with --pulses--

IN THE CLAIMS

Column 5,

Line 54,    replace "disk" with --device--;

UNITED STATES PATENT AND TRADEMARK OFFICE
CERTIFICATE OF CORRECTION

PATENT NO. : 5,202,853

DATED : 13 April 1993

INVENTOR(S) : Yoon-Ho Choi

It is certified that error appears in the above-identified patent and that said Letters Patent is hereby corrected as shown below:

Column 6,

Line 1,     replace "liens" with --lines--;

Line 32,     replace "a" with --the--;

Line 39,     replace ";" with --,--;

Column 9,

Line 18,     insert --transistors are PMOS transistors-- after "sixth";

Column 10,

Line 2,     replace "input drivers" with --bus lines--; and after the semi-colon, and before "and",
                  insert the following paragraph:
                  --plural memory cell array blocks for storing said plurality of data bits provided by said plurality of data input drivers;--;

Line 6,     replace "respectfully" with --respectively--;

UNITED STATES PATENT AND TRADEMARK OFFICE
CERTIFICATE OF CORRECTION

PATENT NO. : 5,202,853
DATED : April 13, 1993
INVENTOR(S) : Yoon-Ho Choi

It is certified that error appears in the above-indentified patent and that said Letters Patent is hereby corrected as shown below:

Column 10, line 8, replace "liens" with --lines--;

Signed and Sealed this

Sixth Day of September, 1994

Attest:

BRUCE LEHMAN

Attesting Officer

Commissioner of Patents and Trademarks